(12) United States Patent
Kim et al.

(10) Patent No.: US 6,818,924 B2
(45) Date of Patent: Nov. 16, 2004

(54) PULSED LASER DEPOSITION OF TRANSPARENT CONDUCTING THIN FILMS ON FLEXIBLE SUBSTRATES

(75) Inventors: Heungsoo Kim, Fairfax, VA (US); James S. Horwitz, Fairfax, VA (US); Zakya H. Kafafi, Alexandria, VA (US); Alberto Pique, Crofton, MD (US); Gary P. Kushto, Crofton, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/440,544

(22) Filed: May 16, 2003

(65) Prior Publication Data

US 2003/0199157 A1 Oct. 23, 2003

Related U.S. Application Data

(62) Division of application No. 09/766,487, filed on Jan. 19, 2001, now Pat. No. 6,645,843.

(51) Int. Cl.⁷ .............................................. H01L 27/15
(52) U.S. Cl. ...................... 257/79; 257/95; 257/103; 257/40; 438/99; 438/608; 438/609
(58) Field of Search .......................... 257/40, 43, 79, 257/749; 438/29, 69, 99, 608–609, 597, 660–662; 427/596

(56) References Cited

U.S. PATENT DOCUMENTS

| 4,970,196 | A | 11/1990 | Kim et al. |
| 5,407,602 | A | 4/1995 | Cava |
| 5,411,772 | A | 5/1995 | Cheung |
| 5,538,767 | A | 7/1996 | Cava et al. |
| 5,628,933 | A | 5/1997 | Carter et al. |
| 5,652,062 | A * | 7/1997 | Cava et al. .................. 428/426 |
| 5,981,306 | A | 11/1999 | Burrows et al. |
| 6,177,151 | B1 | 1/2001 | Chrisey et al. |
| 6,246,071 | B1 | 6/2001 | Qadri et al. |
| 6,458,673 | B1 * | 10/2002 | Cheung ...................... 438/479 |

OTHER PUBLICATIONS

Kim et al., "Transparent Conducting Aluminum–Doped Zinc Oxide Thin films for Organic Light–Emitting Devices", Applied Physics Letters, vol. 76, No. pp. 259–261, Jan. 17, 2000.

Kim et al., Electrical, Optical, and Structural Properties of Indium–Tin–Oxide Thin films for Organic Light–Emitting Devices, Journal of Applied Physics, vol. 86 No. 11 pp. 6451–6461, Dec. 1, 1999.

Transparent Conducting Electrode Materials Grown By Pulsed Laser Deposition for Organic Light–Emitting Devices, Proc. SPIE vol. 3797, pp. 290–300, Organic Light–Emitting Materials and Devices III, Dec. 1999.

Kim et al., Indium Tin Oxide films for Organic Light–Emitting Devices, Applied Physics Letters, vol. 74, No. 23, p 3444, Jun. 7, 1999.

Preparation and Properties of indium Tin Oxide films Deposited on Polyester Substrates by Reactive Evaporation, Thin Solid Films 307 (1997) pp. 200–202.

* cited by examiner

*Primary Examiner*—Kevin M. Picardat
(74) *Attorney, Agent, or Firm*—John J. Karasek; Stephen T. Hunnius

(57) ABSTRACT

The invention relates to the deposition of transparent conducting thin films, such as transparent conducting oxides (TCO) such as tin doped indium oxide (ITO) and aluminum doped zinc oxide (AZO) on flexible substrates by pulsed laser deposition. The coated substrates are used to construct low cost, lightweight, flexible displays based on organic light emitting diodes (OLEDs).

28 Claims, 8 Drawing Sheets

TPD 50

Alq₃ 60

PULSED LASER DEPOSITION OF TRANSPARENT CONDUCTING THIN FILMS ON FLEXIBLE SUBSTRATES

This is a divisional application of U.S. patent application No. 09/766,487, inventors Kim et al., filed Jan. 19, 2001, now U.S. Pat. No. 6,645,843 the entirety of which is herein incorporated by reference.

BACKGROUND OF THE INVENTION

1. Field of the Invention

The invention relates generally to the deposition of transparent conducting thin films on flexible substrates by pulsed laser deposition (PLD), and more particularly to the deposition of thin films such as transparent conducting oxides (TCO) on flexible substrates.

2. Description of the Related Art

Tin doped indium oxide (ITO) and aluminum doped zinc oxide (AZO) thin films, because they combine both transparent and conducting properties, have been widely used as transparent conducting electrodes in optoelectronic devices such as solar cells and flat panel displays (FPDs), surface heaters for automobile windows, camera lenses and mirrors, as well as transparent heat reflecting window material for buildings, lamps, and solar collectors. They are also widely utilized as the anode contact in organic light-emitting diodes (OLEDs). There are several deposition techniques used to grow these TCO films, including chemical vapor deposition (CVD), magnetron sputtering, evaporation, and spray pyrolysis. These techniques require either a high substrate temperature during deposition or a post deposition annealing treatment of the films at high temperatures. These high temperatures generally damage the surfaces of both the substrate and the film. In the typical organic light emitting diode (OLED) geometry, the TCO films are used as the anode contact and are deposited directly onto the transparent glass substrate. In some cases, it is desirable to reverse the device geometry in which case the TCO film would have to be deposited on top of the organic emitting layer. In this case the sputtering technique cannot be used to grow the electrode film because the energetic species (>100 eV) from the sputter target damage the organic layer. This limitation can be overcome by using PLD to deposit the top electrode because the PLD has low energy species due to high background gas pressure.

Glass substrates have been widely used for the development of OLEDs. However, glass substrates are unsuitable for certain applications such as electronic maps and portable computers. Where flexibility or safety issues are important glass is very brittle and cannot be used since it cannot be easily deformed, or is too heavy, especially for large area displays. These disadvantages can be overcome using either plastic or thin metal foil substrates, which can be very lightweight. To develop an advanced OLED technology based on plastic or metal foil supports requires the TCO material to be either grown directly on plastic or on top of the organic emitting layer for metal foil geometry. Passive and active matrix displays such as liquid crystal displays (LCDs) and organic electroluminescent displays will benefit greatly from the use of flexible substrates.

Recently, the growth of ITO films on plastic substrates by sputtering has been reported by T. Minami et al., Thin Solid Film, Vol. 270, page 37 (1995), and J. Ma, Thin Solid Films, vol. 307, page 200 (1997) (both incorporated herewith by reference) with a rough surface morphology (approximately 6 nm of RMS surface roughness) and a high electrical resistivity of $7$–$20 \times 10^{-4}$ Ω-cm. The rough surface morphology and high resistivity of the sputter-deposited ITO films significantly degrade the performance of the OLED.

The current method of depositing TCO films on plastic substrates by sputtering produces a rough surface morphology and high resistivity, which degrades the performance of the OLED. Therefore, there is a strong need for transparent conducting thin films on flexible substrates which exhibit a smooth surface, high optical transparency and low electrical resistivity, which are suitable for use in OLEDs and methods of producing same.

OBJECTS OF THE INVENTION

According to the present invention, the foregoing and other objects are attained by providing TCO thin films on flexible substrates which exhibit a smooth surface, higher optical transparency and lower electrical resistivity and methods of making same.

It is an object of the present invention to provide methods for depositing TCO films on flexible substrates to produce a surface with a smooth surface, higher optical transparency and lower electrical resistivity.

Additional objects and advantages of the invention will be set forth in part in the description which follows, and, in part, will be obvious from the description, or may be learned by practice of the invention.

SUMMARY OF THE INVENTION

The foregoing objects of the present invention are achieved by providing a transparent conducting thin film on a flexible substrate and method for depositing transparent conducting films on flexible substrates The present invention comprises a TCO thin film deposited on a flexible substrate such that it produces a surface with a smooth surface, higher optical transparency and lower electrical resistivity.

The present invention comprises a method of depositing TCO films on flexible substrates using pulsed laser deposition.

BRIEF DESCRIPTION OF THE DRAWINGS

These and other objects and advantages of the invention will become apparent and more readily appreciated from the following description of the preferred embodiments, taken in conjunction with the accompanying drawings of which:

FIGS. 4(a), 4(b) and 4(c) show the atomic force microscopy (AFM) images (2 μm×2 μm) of: FIG. 4(a) a bare PET substrate; FIG. 4(b) an ITO film coated on PET; and FIG. 4(c) an AZO film coated on PET by PLD. The rms surface roughness of ITO and AZO films is about 3 nm and 4 nm, respectively while that of the bare PET substrate is about 9 nm. Note that the scale in the z-direction (50 nm/div.) is greatly expanded with respect to the scales in the x and y directions (1.0 μm/div.).

FIGS. 5(a) and 5(b) show the atomic force microscopy (AFM) images (2 μm×2 μm) of: FIG. 5(a) a bare flexible Si substrate (25 nm thick) and FIG. 5(b) an ITO film coated on flexible Si by PLD. The rms surface roughness is about 1.3 nm and 0.9 nm for Si substrate and ITO film, respectively.

FIGS. 6(a) and 6(b) show the atomic force microscopy (AFM) images (300 nm×300 nm) of: FIG. 6(a) a bare Ag foil and FIG. 6(b) an ITO film coated on Ag foil by PLD. The rms surface roughness is about 0.8 nm and 0.7 nm for Ag foil and ITO film, respectively.

DESCRIPTION OF THE PREFERRED EMBODIMENTS

Figure 1:
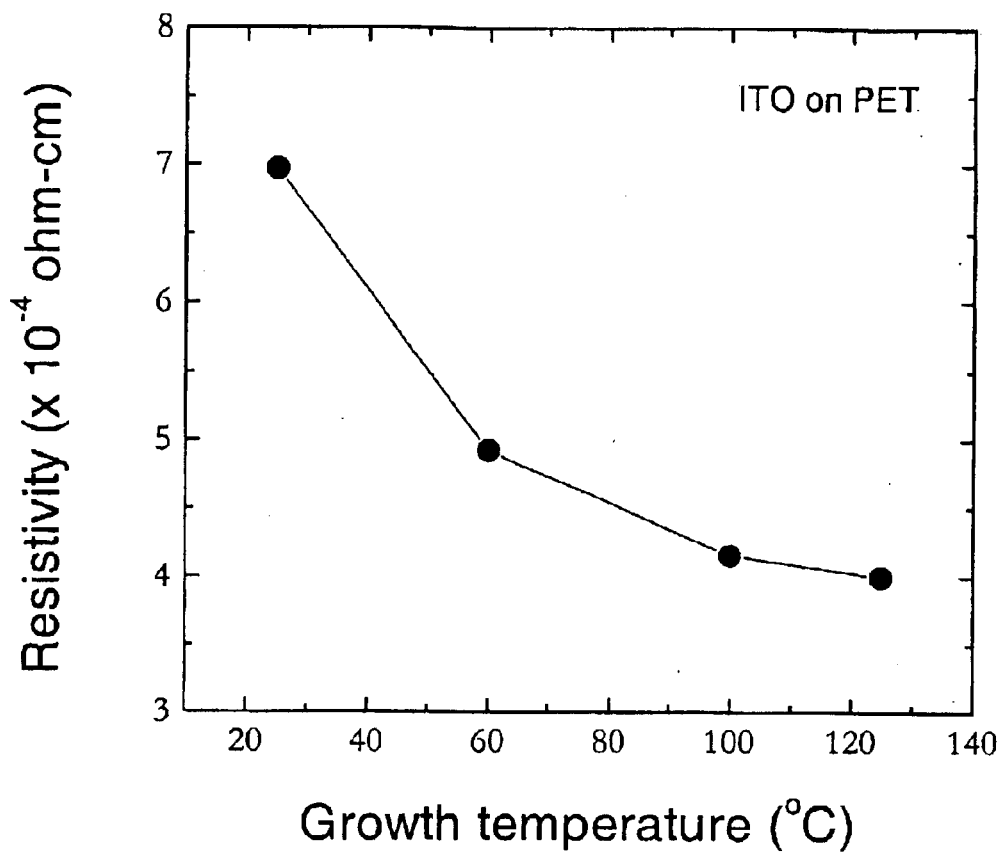
FIG. 1 shows the electrical resistivity ($\rho$) of ITO films deposited on PET substrate, plotted as a function of film growth temperature. All films were deposited in 40 mTorr of oxygen. The minimum resistivity occurs at the maximum growth temperature. The film thickness is about 200 nm for all films.
Figure 2:
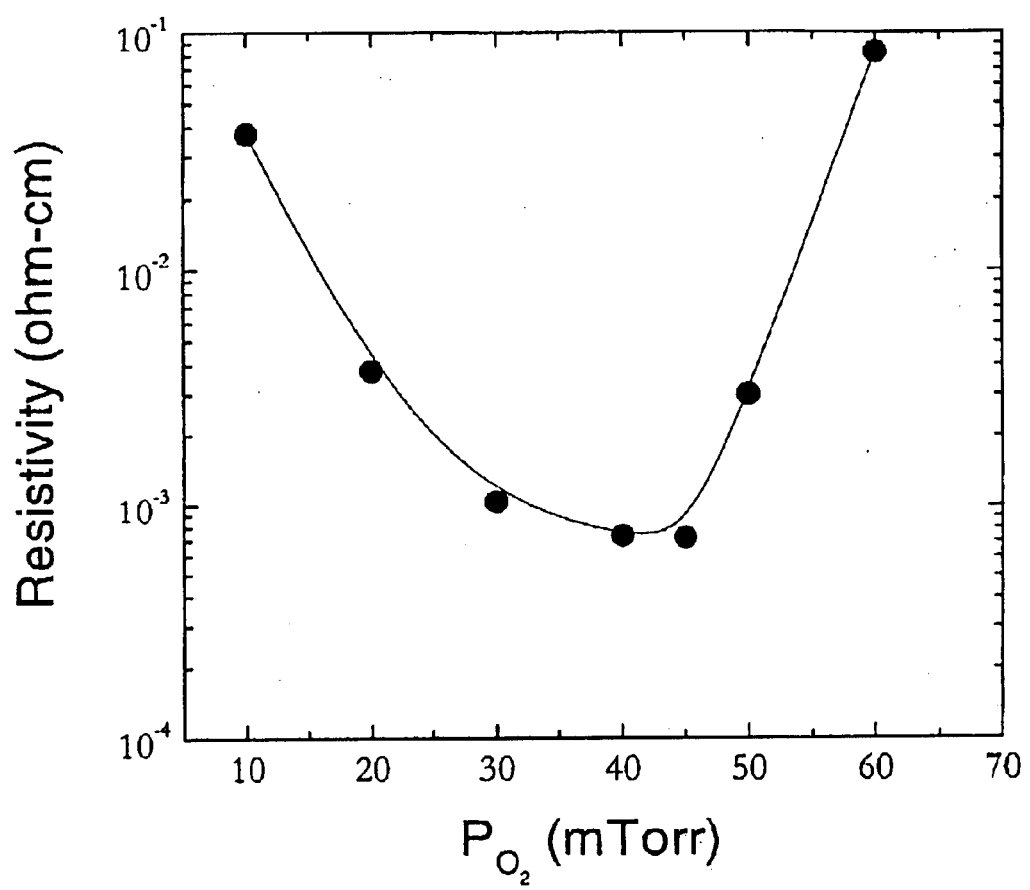
FIG. 2 shows the electrical resistivity ($\rho$) of ITO films deposited on PET substrate, plotted as a function of oxygen deposition pressure ($Po_2$). All films were deposited at 25° C. There is an optimum oxygen deposition pressure at which the resistivity is a minimum, which is observed at 40 mTorr in this system. The film thickness is about 200 nm for all films.
Figure 3:
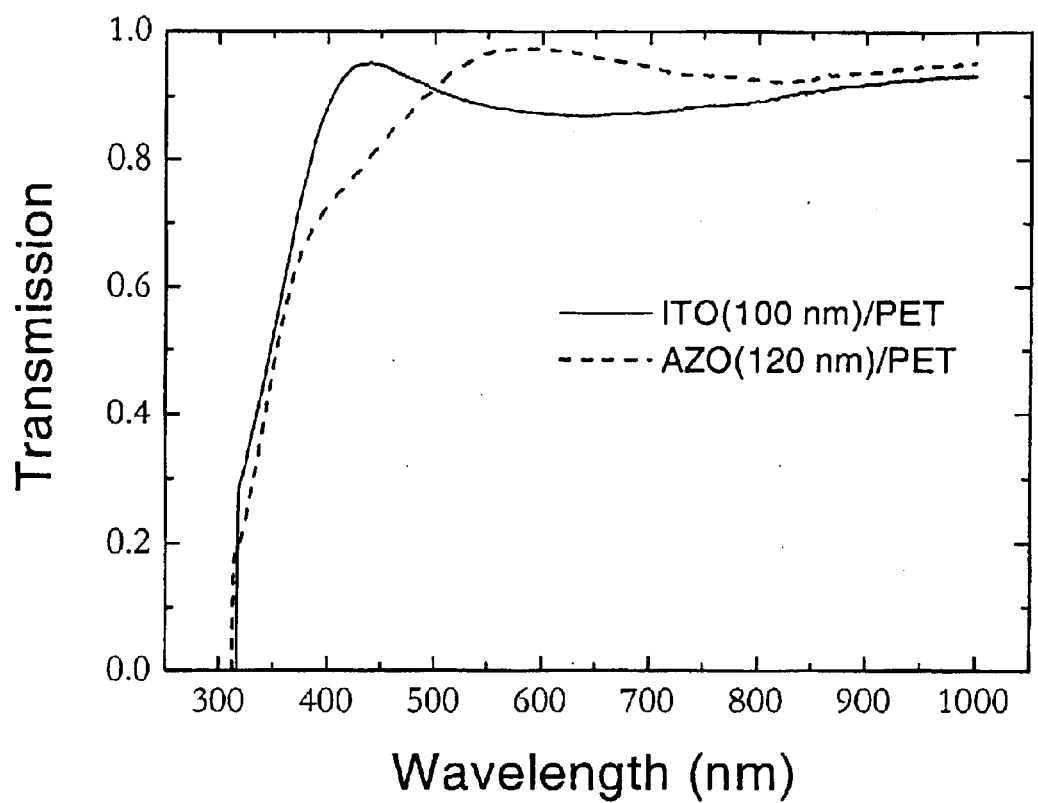
FIG. 3 shows optical transmission spectra of ITO and AZO films deposited on PET substrates. Both films were deposited at 25° C. and in 40 mTorr of oxygen. The average transmission in the visible range (400–700 nm) is 90% and 91% for the ITO and AZO films, respectively. The film thickness is about 100 nm for all films.
Figure 4A:
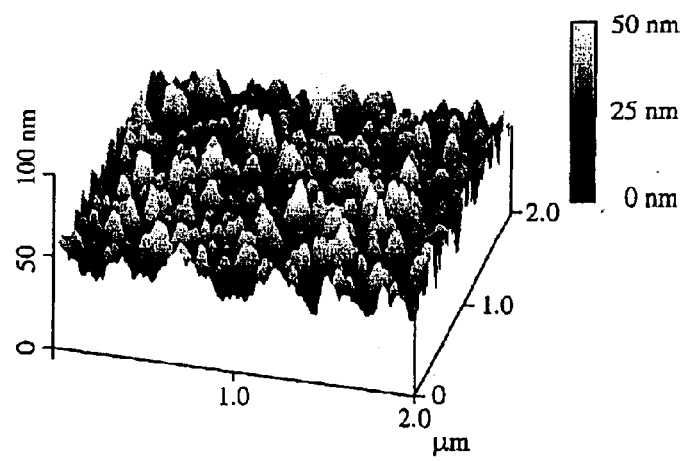
Figure 4B:
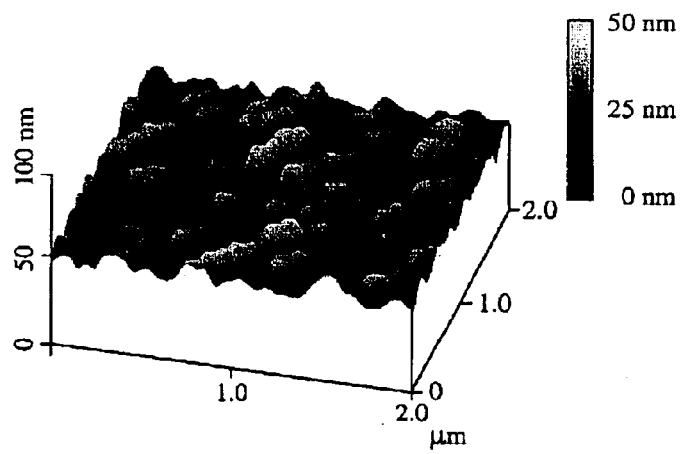
Figure 4C:
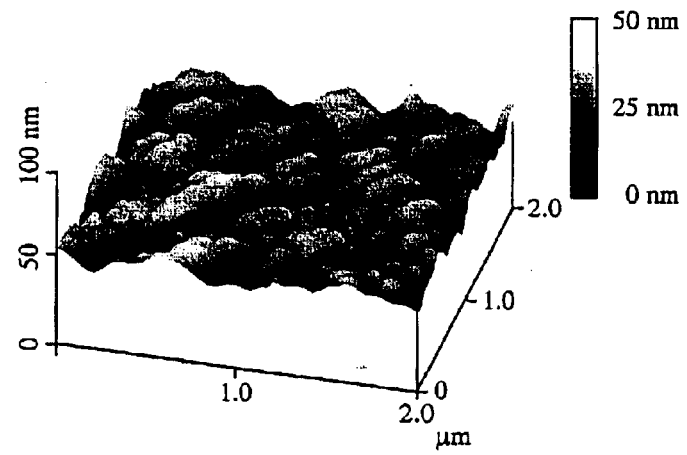
Figure 5A:
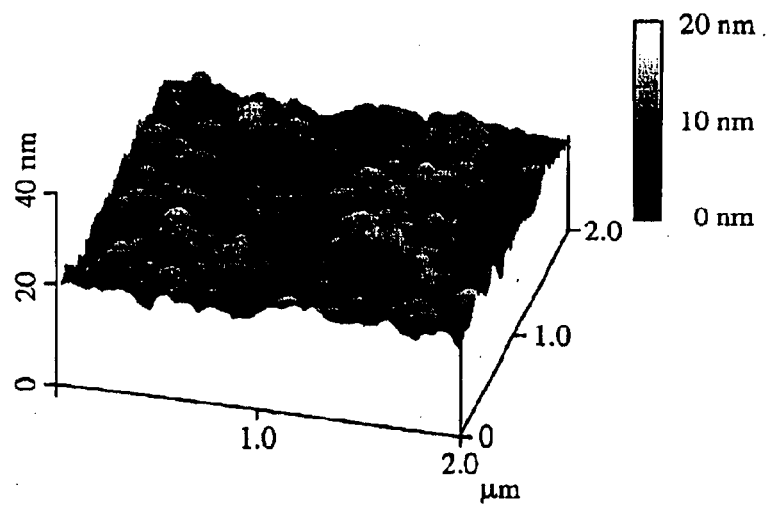
Figure 5B:
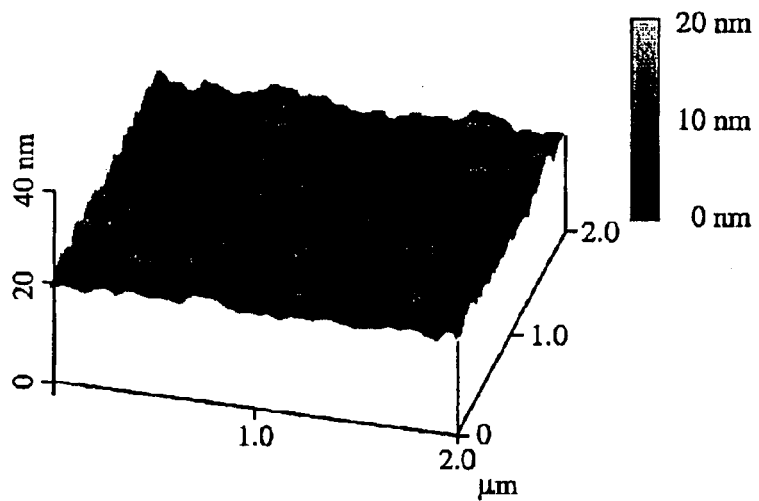
Figure 6A:
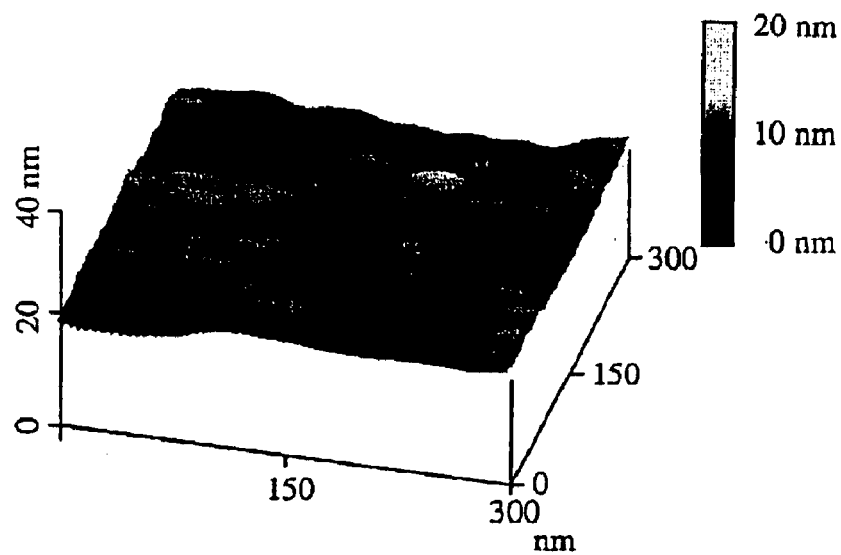
Figure 6B:
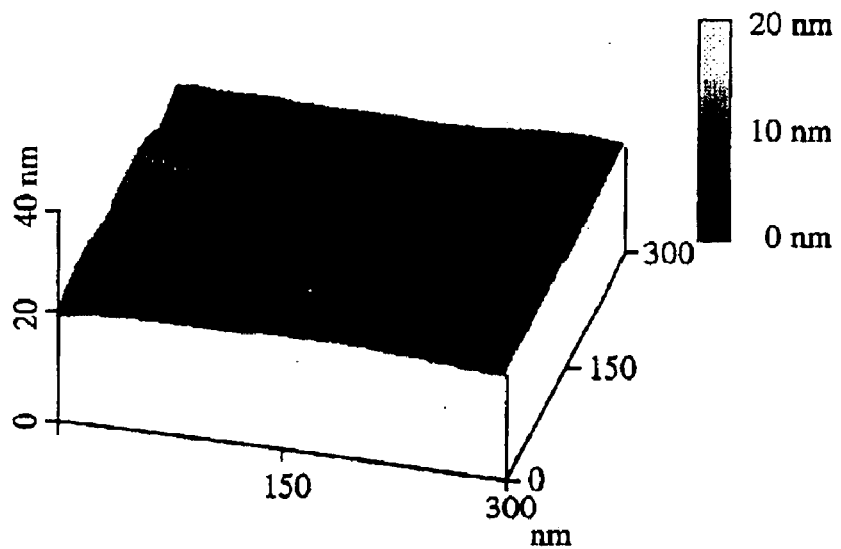

The present invention comprises a method of depositing transparent conducting films on flexible substrates using pulsed laser deposition and a transparent conducting film deposited on a flexible substrate, and OLED devices incorporating a transparent conducting film deposited on a flexible substrate.

EXAMPLE 1

A KrF excimer laser (248 nm and 30 ns FWHM) was operated at 10 Hz and focused through a 50-cm focal lens onto a rotating target at 45° angle of incidence. The energy density of the laser beam at the target surface was maintained at 1 J/cm$^2$. The target-to-substrate distance was 5.8 cm. The target composition for deposition of the ITO film was 5 wt % $SnO_2$-doped $In_2O_3$ and the oxygen deposition pressure was 40 mTorr.

Using the above target composition and oxygen pressure, ITO was deposited on flexible substrates such as polyethylene terephthalate (PET) by PLD at room temperature. The temperatures used for deposition ranged from approximately 25–125° C. AFM measurement indicated that the RMS surface roughness of the PLD ITO films on PET is about 2–3 nm, which is a half of that measure with commercially available sputter-deposited ITO films on PET. Furthermore, the electrical resistivity of the PLD ITO films on PET is observed to be $6.0 \times 10^{-4}$ Ω-cm, which is the lowest ever reported for films deposited on flexible substrates at room temperature by any method. In addition, the optical transmission of the PLD ITO films on PET is greater than 85% in the visible range (400–700 nm). AZO films grown by PLD on PET substrates at room temperature show very smooth surface morphology (RMS surface roughness of 2–3 nm), with low resistivity ($7 \times 10^{-4}$ Ω-cm) and high transparency (>87%).

ITO and AZO films grown by PLD deposited on PET demonstrated a planarizing effect. On PET, the surface roughness is reduced from 8–10 nm for the uncoated material to 3 nm for the coated material. These smooth ITO films can significantly improve the device performance of flat panel displays such as LCDs and OLEDs.

ITO and AZO films deposited on PET substrates show approximately a factor of 3 improvement (2 nm vs. approximately 6 nm) in surface morphology and improved electrical properties (20–30 Ω/sq. vs. 70–80 Ω/sq.) compared to commercially available ITO films grown on PET by sputtering.

ITO films were deposited using silver foil as the flexible substrate using PLD. The deposited films show a surface roughness that is comparable or better than the surface roughness of the substrate. The RMS roughness of the silver foil substrate before the deposition of the ITO film was 0.7 nm, and the RMS roughness of the film after deposition of the ITO film was also 0.7 nm.

ITO films were deposited using a thin silicon wafer as the flexible substrate using PLD. The RMS roughness of the thin silicon wafer substrate before the deposition of the ITO film was 1.3 nm, and the RMS roughness of the film after deposition was also 1 nm.

EXAMPLE 2

OLEDs were constructed using the transparent conducting films deposited by pulsed laser deposition.

Figure 7A:
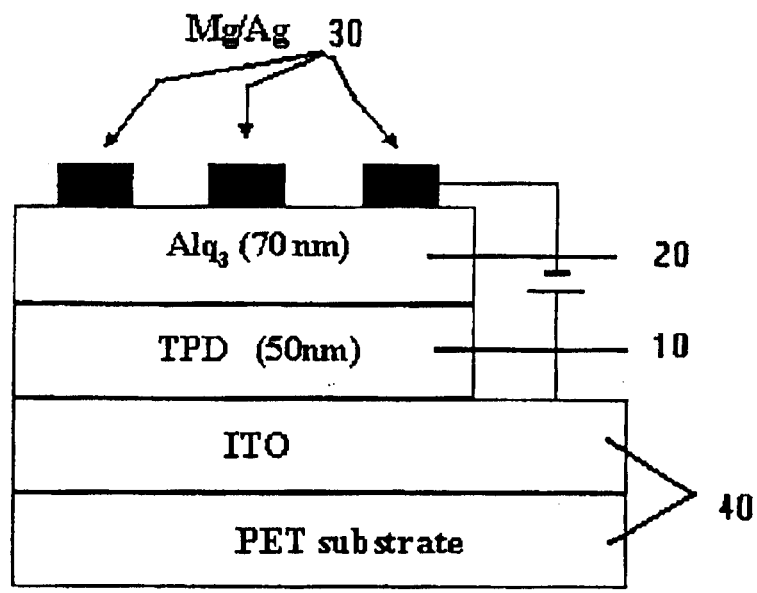
FIG. 7(a) shows an OLED device configuration.
Figure 7B:
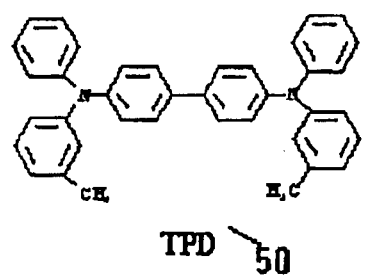
FIG. 7(b) shows the chemical structures of the organic materials used in FIG. 7(a).
Figure 7B:
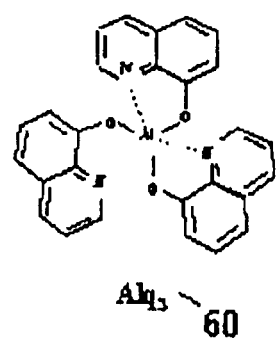

ITO thin films, deposited by PLD on PET substrates, were used as anode contacts in organic light-emitting diodes (OLEDs). The performance of the device was measured. FIG. 7(a) shows the OLED device configuration and FIG. 7(b) shows the chemical structures of the organic materials used in this research. The device structure consists of a hole transport layer (HTL) 10, of N, N'-diphenyl-N, N-bis(3-methylphenyl)1,1'-diphenyl-4,4'diamine (TPD), 50, and an electron transport/emitting layer (ETL/EML) 20, of tris(8-hydroxyquinolinolato) aluminum (III) (Alq3), 60. The cathode contact 30, deposited on top of the ETL 20, is an alloy of Mg:Ag (ratio=12:1 by weight). Devices were fabricated by high vacuum vapor deposition, with a background pressure of $1 \times 10^{-7}$ Torr. ITO coated substrates 40, were cleaned by an oxygen plasma asher. After the deposition of the organic layers, the Mg/Ag alloy was deposited through a shadow mask by coevaporation from separate sources. The active emissive area of the device is approximately 2 mm×2 mm. The current-voltage-luminance (I-V-L) data were taken in $N_2$ atmosphere using a Keithley 238 current/voltage source and a luminance meter (Minolta LS-110).

Figure 8A:
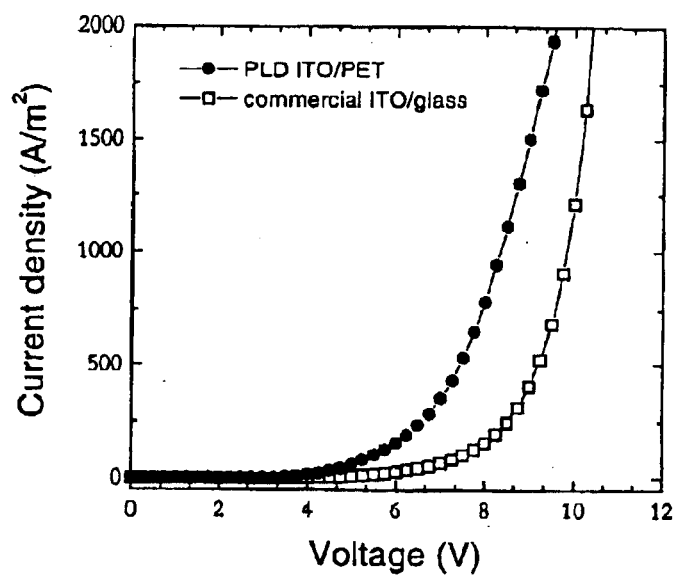
FIG. 8(a) is a graph of the current density (J) versus applied voltage (V).
Figure 8B:
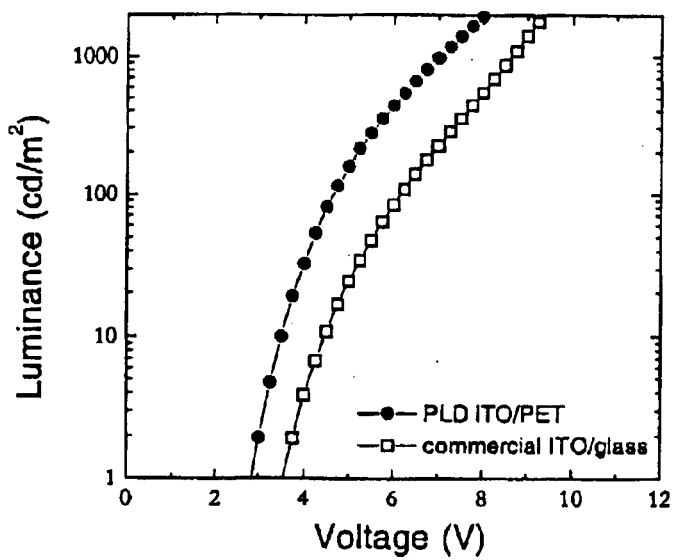
FIG. 8(b) is a graph of luminance (L) versus applied voltage (V) characteristics for devices based on PLD ITO/PET and commercial ITO/glass.

FIG. 8 is a graph showing the characteristics of current density (J)-voltage (V) and luminance (L)-voltage (V) output for OLEDs fabricated using a PLD ITO film on PET and using a commercial ITO (supplied by Applied Films, USA) on glass. The thickness of both ITO films was approximately 100 nm. The J-V curves show a typical diode behavior, with current and luminance power output observed only in the forward bias. FIG. 8(a) is a graph that shows that a current density of 100 A/m$^2$ was obtained at approximately 5.5 V for the PLD ITO/PET device while the same current density was observed at a voltage of approximately 7.5 V for the commercial ITO/glass device. FIG. 8(b) is a graph that shows that a luminance level of 1000 cd/m$^2$ is obtained at only 7 V in the device on PET, while the same value of luminance is observed at 8.5 V for the device on glass. The reduction in the drive voltage and high luminance efficiency make an ITO coated PET substrate very promising for future OLED application.

Although a few embodiments of the present invention have been shown and described, it would be appreciated by those skilled in the art that changes may be made in these embodiments without departing from the principles and spirit of the invention, the scope of which is defined in the claims and their equivalents.

We claim:

1. A transparent conducting film deposited on a flexible substrate made by providing a flexible substrate;
   providing a target made of a transparent conducting material; and
   exposing said target to a source of laser energy to lift the transparent conducting material from the surface of the target, the target and the substrate being oriented with respect to each other such that the lifted transparent conducting material is deposited as a film upon said substrate.

2. The transparent conducting film of claim 1 wherein the flexible substrate is plastic.

3. The transparent conducting film of claim 1 wherein the flexible substrate is metal foil.

4. The transparent conducting film of claim 1 the flexible substrate is silicon.

5. The transparent conducting film of claim 1 wherein the transparent conducting material is a transparent conducting oxide.

6. The transparent conducting film of claim 1 wherein the transparent conducting material is tin doped indium oxide.

7. The transparent conducting film of claim 1 wherein the transparent conducting material is aluminum doped zinc oxide.

8. The transparent conducting film of claim 1 wherein the substrate is at a temperature of approximately 25–125° C.

9. An organic light emitting device (OLED) wherein anode contacts are comprised of the transparent conducting film of claim 1.

10. The OLED of claim 9, wherein said OLED has a flexible substrate selected from the group consisting of plastic, metal foil, or silicon.

11. The transparent conducting film of claim 1 wherein the film has a RMS roughness of about 0.7–2.0 nm.

12. The transparent conducting film of claim 1 wherein the film has a RMS roughness of about 0.7–1.0 nm.

13. The transparent conducting film of claim 1 wherein the film has a RMS roughness of about 0.7–1.5 nm.

14. The transparent conducting film of claim 1 wherein the film has an electrical resistivity of about $5\times10^{-4}$–$9\times10^{-4}$ ohms-cm.

15. The transparent conducting film of claim 1 wherein the film has an electrical resistivity of about $7\times10^{-4}$ ohms-cm.

16. An organic light emitting device comprising:
   a flexible substrate;
   a transparent conducting material wherein said transparent conducting material is deposited on said flexible substrate by exposing a target comprised of said transparent conducting material to a source of laser energy to lift said transparent conducting material from the surface of the target, the target and the substrate being oriented with respect to each other such that the lifted transparent conducting material is deposited as a film upon said substrate.

17. The organic light emitting device claim 16 wherein the flexible substrate is plastic.

18. The organic light emitting device claim 16 wherein the flexible substrate is metal foil.

19. The organic light emitting device of claim 16 wherein the flexible substrate is silicon.

20. The organic light emitting device of claim 16 wherein the film has an electrical resistivity of about $7\times10^{-4}$ ohms-cm.

21. The organic light emitting device claim 16 wherein the transparent conducting material is a transparent conducting oxide.

22. The organic light emitting device of claim 16 wherein the transparent conducting material is tin doped indium oxide.

23. The organic light emitting device of claim 16 wherein the transparent conducting material is aluminum doped zinc oxide.

24. The organic light emitting device of claim 16 wherein the film has a RMS roughness of about 0.7–1.0 nm.

25. The organic light emitting device of claim 16 wherein the film has an electrical resistivity of about $5\times10^{-4}$–$9\times10^{-4}$ ohms-cm.

26. The organic light emitting device of claim 23 wherein the film has an electrical resistivity of about $7\times10^{-4}$ ohms-cm.

27. The organic light emitting device of claim 26 wherein the film has a RMS roughness of about 0.7–1.0 nm.

28. An organic light emitting device comprising:
   a plastic substrate;
   a transparent conducting oxide, wherein said transparent conducting oxide is a film deposited by laser energy and wherein said film has an electrical resistivity of about $7\times10^{-4}$ ohms-cm and a RMS roughness of about 0.7–1.0 nm.

* * * * *